US010181849B1

United States Patent
Naass et al.

(10) Patent No.: US 10,181,849 B1
(45) Date of Patent: Jan. 15, 2019

(54) TRANSISTOR CONTROL TERMINAL CONTROL CIRCUIT

(71) Applicant: NXP B.V., Eindhoven (NL)

(72) Inventors: Tarik Naass, Korschenbroich (DE); Matthias Rose, Helmond (NL); Henricus Cornelis Johannes Buthker, Mierlo (NL); Arnoud Pieter Van Der Wel, Vught (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/825,797

(22) Filed: Nov. 29, 2017

(51) Int. Cl.
| | | |
|---|---|---|
| *G05F 3/26* | (2006.01) | |
| *H03K 17/687* | (2006.01) | |
| *H02M 3/07* | (2006.01) | |

(52) U.S. Cl.
CPC ......... *H03K 17/6872* (2013.01); *G05F 3/262* (2013.01); *H02M 3/07* (2013.01)

(58) Field of Classification Search
None
See application file for complete search history.

(56) References Cited

U.S. PATENT DOCUMENTS

| | | | | |
|---|---|---|---|---|
| 6,750,638 B1* | 6/2004 | Gang | ...................... | G05F 1/575 323/280 |
| 7,310,006 B2* | 12/2007 | Shimada | .............. | H03K 17/063 326/83 |
| 8,664,997 B2 | 3/2014 | Ji | | |
| 8,680,828 B2* | 3/2014 | Heng | ...................... | G05F 1/575 323/275 |
| 9,755,511 B2* | 9/2017 | Lee | ..................... | H05B 33/0815 |
| 2009/0146714 A1 | 6/2009 | Nakamori et al. | | |

OTHER PUBLICATIONS

Texas Instruments, "Product Bulletin: Gate Driver for Enhancement Mode GaN Power FETs", http://www.ti.com/lit/ml/snvb001.pdf, 2012.
Lobsiger, Y., "Closed-Loop di/dt and dv/dt IGBT Gate Driver", IEEE Transactions on Power Electronics, vol. 30, No. 6, Jun. 2015.

* cited by examiner

*Primary Examiner* — Jeffery S Zweizig
(74) *Attorney, Agent, or Firm* — David G. Dolezal

(57) ABSTRACT

A control circuit provides a signal to a control terminal of the transistor to control the conductivity of the transistor. The control circuit includes a voltage-to-current converter that provides an indication of the control terminal-to-current terminal voltage of a transistor. The control circuit includes control circuitry that uses the indication from the voltage-to-current converter in controlling the current applied to the control terminal.

21 Claims, 3 Drawing Sheets

TRANSISTOR CONTROL TERMINAL CONTROL CIRCUIT

BACKGROUND OF THE INVENTION

Field of the Invention

This invention relates in general to a control circuit for a control terminal of a transistor.

Description of the Related Art

Transistor control terminal control circuits such as e.g. gate driver circuits, are used to control the conductivity of a transistor such as a power MOSFET.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, a control circuit provides a signal to a control terminal of the transistor to control the conductivity of the transistor. The control circuit includes a voltage-to-current converter that provides an indication of the control terminal-to-current terminal voltage of a transistor. The control circuit includes control circuitry that uses the indication from the voltage-to-current converter in controlling the current applied to the control terminal. In some embodiments, the control circuitry uses the indication to control the current applied to the control terminal by reducing the current provided by a charge pump to the control terminal based on the indication. In other embodiments, the control circuitry uses the indication to control the current applied to the control terminal by reducing the current discharged from the control terminal based on the indication.

In some applications, including applications involving power conversion, low-resistive power transistors are utilized for achieving low conduction loses and high power conversion efficiency. In some embodiments, it is desirable to accurately control a control terminal-to-current terminal voltage (e.g. gate-source voltage for a FET) to minimize the on-resistance by driving the transistor as close as possible to its maximum allowed control terminal-to-current terminal voltage. However, process variation in the transistor and device mismatch can make such accurate voltage control difficult. Moreover, during switching of the transistor, the voltage slope of the control terminal-to-current terminal voltage may be uncontrolled which can cause an over voltage event and increase electromagnetic emissions.

In some embodiments, providing a voltage-to-current converter for generating an indication of the control terminal-to-current terminal voltage of a transistor may provide for a control terminal control circuit that can more accurately control the current applied to the control terminal of the transistor. With such a feature in some embodiments, the current can be controlled to more accurately control the control terminal-to-current terminal voltage to achieve the lowest possible on resistance by the transistor and to reduce overvoltage issues of the control terminal-to-current terminal voltage during switching to reduce electromagnetic emissions and prevent reliability issues.

Figure 1:
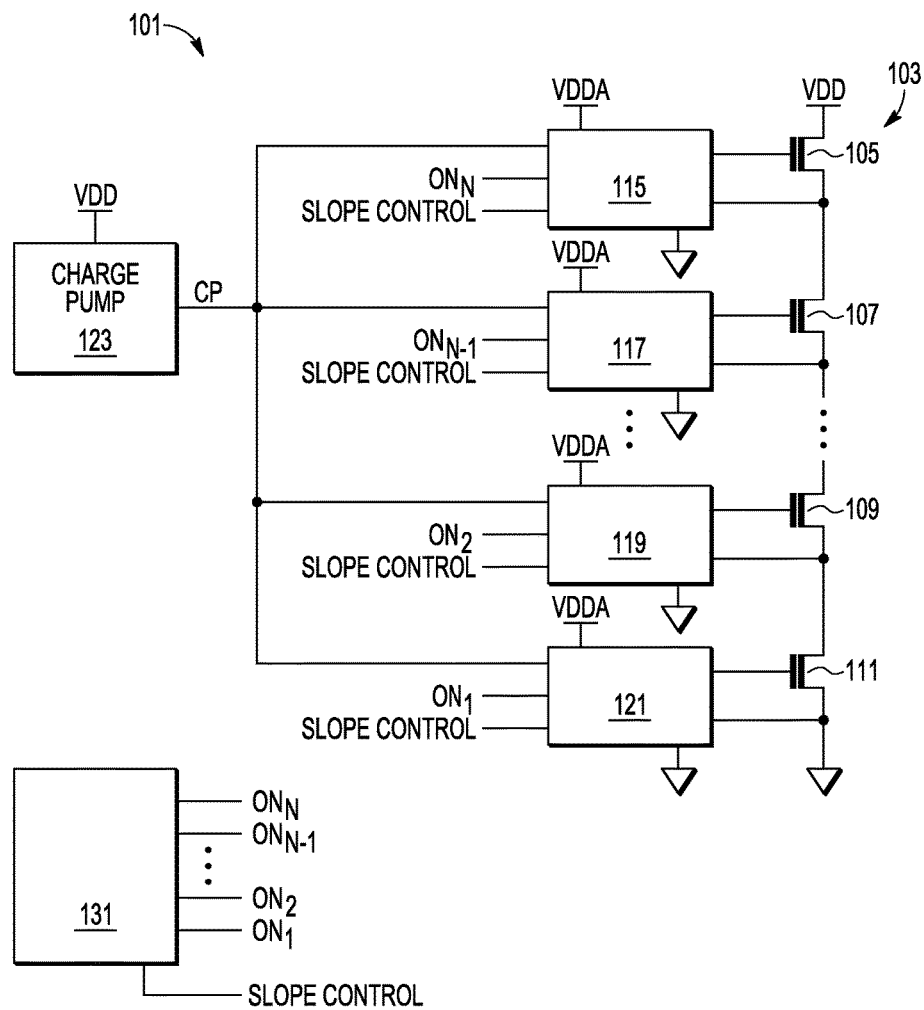
FIG. 1 is a circuit diagram of a circuit that implements transistors stacked in series according to one embodiment of the present invention.

FIG. 1 is a circuit diagram of a circuit 101 with a stack of transistors stacked in series where each transistor of the stack includes a corresponding control terminal control circuit according to one embodiment of the present invention. In FIG. 1, transistor stack 103 includes four transistors 105, 107, 109, and 111 stacked in series between VDD and ground power supply terminals. In the embodiment shown, transistors 105, 107, 109, and 111 are power NFET transistors, but maybe of other types of transistors in other embodiments, such as PFETS, GaN devices, GaAs devices, IGBTs, or bipolar transistors. Each control terminal (e.g. a gate for a FET or a base for a bipolar transistor) is connected to a corresponding control circuit 115, 117, 119, and 121 for providing a control signal to the control terminal of the transistor. For some FET devices, control circuits 115, 117, 119, and 121 may be characterized as gate drivers in some embodiments. Each control circuit includes an input to receive an ON signal ($ON_1$-$ON_N$) and a slope control signal (SLOPE CONTROL) from a controller 131. The ON signal indicates when the transistor should be in a conductive state and the slope control signal controls the amount of charging current provided to the control terminal of a transistor (105, 107, 109, and 111) during a change in conductivity states of the transistor.

Each control circuit (115, 117, 119, and 121) includes an input (CP) for receiving current from a charge pump 123 for charging the control terminals of the transistors 105, 107, 109, and 111 in raising and holding the voltage of the control terminal during a charging operation. Control circuits 115, 117, 119 and 121 control the amount of current provided to the control terminals from charge pump 123 during a charging operation. In some embodiments, VDD is higher than the supply voltage (VDDA) provided to the control circuits (115, 117, 119, and 121). In some embodiments, the voltage of the output of the charge pump may be higher than VDD. In one embodiment, VDD is 1.5 volts, the charge pump voltage is 6 volts higher than VDD, and VDDA is 1.8 volt. However, in other embodiments, these values may be different depending on circuit implementation. For example, in some embodiments, the voltage of charge pump 123 output may be in the range of 4-70 volts. In some embodiments, VDD can vary during operation, e.g. in a range between 1.5 Volts to 60 Volts.

Control circuits 115, 117, 119, and 121 also control the discharge rate of current discharged from the control terminal in lowering the voltage of the control terminal during a switching operation of a transistor or in holding the voltage of the control terminal at a ground power supply voltage.

With some of these embodiments, the sources of stack 103 float with respect to ground. With the control circuits 115, 117, 119, and 121 shown and described herein, a separate floating power supply block may not be needed for each transistor. Instead, one charge pump 123 may supply the control terminal charge current for all transistors of stack 103.

In other embodiments, stack 103 is implemented with GaN FETs. Because with some GaN FETs, the gates have a Schottky gate contact instead of an insulated gate contact, the gate-source voltage requirements may be more stringent. For example, the gate-source voltage may be specified at 5 volts with a maximum value of 6 volts. Accordingly, circuit 101 may provide for a tighter charge current control to prevent overvoltage conditions.

Circuit 101 can be used in many types of applications. In one embodiment, stack 103 is used as an LED matrix driver wherein each node of stack 103 drives a specific LED or LEDs in series. In another embodiment, stack 103 is used as a cell-level photovoltaic converter.

In another embodiment, stack 103 is used as a USB power source to provide +5 volts. In some of these embodiments, stack 103 includes lower voltage transistors that are cascaded to withstand a higher supply voltage to meet USB required functionality with lower voltage devices. Circuit 101 may advantageously allow for such a circuit without the need for floating power supplies for each cascaded transistor. In another embodiment, stack 103 can also be used to balance cell voltages in a stack of Li-ion automotive traction batteries.

In other embodiments, circuit 101 may have other configurations. For example, each transistor of stack 103 may include its own charge pump. In some embodiments, stack 103 may be connected to a power supply voltage terminal of another voltage other than a ground terminal (e.g. −20 Volts). In some embodiments, each control circuit 115, 117, 119, and 121 may receive the same ON signal line. Further, in some embodiments, stack 103 may include a greater or fewer number of transistors stacked in series.

Figure 2:
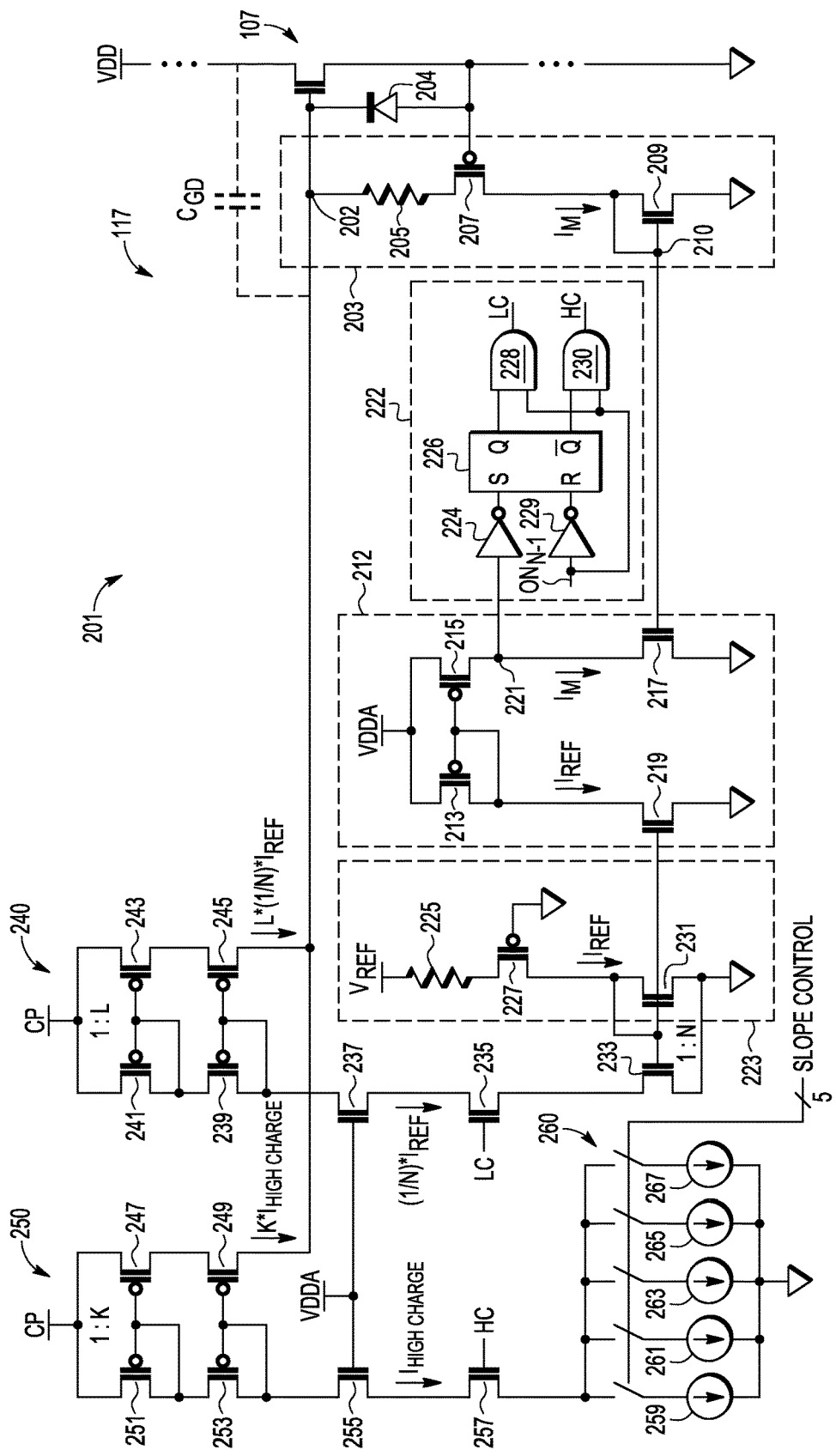
FIG. 2 is a circuit diagram of a portion of a control terminal control circuit according to one embodiment of the present invention.

FIG. 2 is a circuit diagram of a portion of control circuit 117 that is utilized in providing charge current to raise or maintain the voltage of a control signal provided to the gate (node 202) of transistor 107. Circuit 117 includes a voltage-to-current converter 203 for providing an indication of the gate-source voltage of transistor 107. In the embodiment shown, voltage-to-current converter 203 includes a resistor 205 and a PFET 207 whose source is directionally coupled to the gate (node 202) of transistor 107 through resistor 205. In one embodiment, resistor 205 is a poly resistor, but may be another type of resistor in other embodiments. The gate of transistor 207 is connected to the source of transistor 107. Converter 203 includes an NFET 209 in a diode configuration. During operation, converter 203 produces a current $I_M$ that is indicative of the difference between the voltage of the gate and the voltage of the source (gate-source voltage) of transistor 107.

The greater the gate-source voltage of transistor 107, the greater the current $I_M$ in that the PFET 207 becomes more conductive. PFET 207 becoming more conductive pulls the voltage of the gate (node 210) of transistor 209 higher which causes transistor 209 to be more conductive as well. The voltage of node 210 is indicative of the current $I_M$, which is indicative of the gate-source voltage of transistor 107. Utilizing a voltage-to-current converter to measure the gate-source voltage allows for a measurement of the gate-source voltage of a transistor regardless of the position of the transistor in stack 103. Thus, converter 203 can measure the gate-source voltage of transistor 107 even if the source voltage of transistor 107 is above VDDA, which is the supply voltage to other circuitry of control circuit 117. In the embodiment shown, circuit 117 includes a diode 204 connected between the gate of transistor 107 and to the source of transistor 107 for limiting the gate voltage to a source voltage minus a diode voltage when the gate is discharged to ground during an off state.

Circuit 117 includes a reference circuit 223. Reference circuit 223 includes a PFET 227, a resistor 225, and a transistor 231. Reference circuit 223 produces a current $I_{REF}$ which is an indication of the reference voltage ($V_{REF}$). In some embodiments, $V_{REF}$ is set to a voltage that corresponds to a desired maximum gate-source voltage of transistor 107. In one embodiment, $V_{REF}$ is set to 3 volts, but may be set to other values in other embodiments. The control terminal of transistor 227 is tied to ground. In one embodiment, resistor 225 is the same size and same type of device as resistor 205 and transistor 227 is the same size and type of transistor as transistor 207. In some embodiments, making these devices the same size and type may improve the accuracy of circuit 117 in $I_M$ matching $I_{REF}$ when $V_{GS}$ of transistor 107 matches $V_{REF}$.

Circuit 117 includes a current comparator circuit 212 for comparing $I_M$ with $I_{REF}$ and providing an indication at node 221 of whether $I_{REF}$ or $I_M$ is larger. $I_M$ being larger than $I_{REF}$ indicates that the gate-source voltage of transistor 107 is higher than $V_{REF}$. Circuit 212 includes PFETs 213 and 215 and NFETs 219 and 217. Transistor 217 forms a current mirror with transistor 209 to mirror $I_M$ in one leg of comparator circuit 212, and transistor 219 forms a current mirror with transistor 231 to mirror $I_{REF}$ in the other leg of circuit 212. If $I_M$ is greater than $I_{REF}$ (indicating that the gate-source voltage of transistor 107 is greater than $V_{REF}$), then node 221 is pulled to a low voltage by a transistor 217 being more conductive than transistor 219. If $I_M$ is less than $I_{REF}$ (indicating that the gate-source voltage of transistor 107 is less than $V_{REF}$), node 221 is at a high voltage. In other embodiments, current comparator circuit 212 may include a current source (not shown) in the leg of transistor 219 that provides a current indicative of the reference voltage without the unitization of a current mirror.

Circuit 117 includes a charge rate control circuit 222 for controlling whether node 202 is being charged at a higher current or a lower current. Circuit 222 includes inverters 224 and 229, an SR flip-flop 226, and AND gates 228 and 230. The output of inverter 224 is connected to the SET input of flip-flop 226 and RESET input of flip-flop 226 receives the inverted $ON_{N-1}$ signal from inverter 229. The $ON_{N-1}$ signal, when high, indicates that transistor 107 should be in a conductive state. The Q output of flip-flop 226 is connected to an input of AND gate 228 and the bar Q input is connected to AND gate 230. The $ON_{N-1}$ signal is connected to the other inputs of both AND gates 228 and 230. When the $ON_{N-1}$ signal is in a state indicating that transistor 107 is to be non conductive, the RESET input is high and flip-flop 226 is reset (Q=low, bar Q=H). When the $ON_{N-1}$ signal transitions to a state indicating that transistor 107 is to be conductive, both AND gates 228 and 230 are enabled. If node 221 is high (indicating that the gate-source voltage of transistor 107 is less than $V_{REF}$ which is the condition when transistor 107 begins transitioning from a non conductive state to a conductive state), the SET input will be low, HC will be high, and LC will be low. If node 221 is low (indicating that the gate-source voltage of transistor 107 is greater than $V_{REF}$ after transistor 107 becomes fully conductive), then the SET input will be high and LC will be high and HC will be low. Providing a charge rate control circuit 222 with a latch (flip-flop 226) prevents circuit 117 from toggling back and forth between a higher charging current and a lower charging current of node 202 during a charging operation when the gate-source voltage of transistor 107 is around $V_{REF}$.

Circuit 117 includes a high charge current circuit 250 and a low charge current circuit 240, each for controlling the amount of charge current provided to the gate of transistor 107 from charge pump 123 when the $ON_{N-1}$ signal is high. High charge current circuit 250 includes a current mirror made up of transistors 251, 247, 253 and 249. In one embodiment, the current mirror of transistors 251, 247, 253, and 249 is configured to multiply the current ($I_{HIGHCHARGE}$) through the current path of transistors 251 and 253 by a multiplier of K to provide node 202 with a charge current of $K*I_{HIGHCHARGE}$. In one embodiment K is 10, but may be of other values in other embodiments. Circuit 250 includes a buffer transistor 255, whose gate is connected to a VDDA power supply terminal, and a control transistor 257 for enabling circuit 250. The gate of transistor 257 receives the HC signal from circuit 222. Some embodiments do not include buffer transistors 255 and 237 depending upon the CP voltage range and the voltage blocking capability of slope control circuit 260 and transistors 233, 235 and 257.

Circuit 250 includes a slope control circuit 260 for setting the $I_{HIGHCHARGE}$ current. Circuit 260 includes a number of current sources (259, 261, 263, 265, and 267). In one embodiment, each current source (259, 261, 263, 265, and 267) provides a different current value (e.g. 3.5, 7, 14, 28, and 56 uA). The SLOPE CONTROL signal controls which current sources are enabled to set the desired current level of $I_{HIGHCHARGE}$ through transistor 257 and transistor 255 when transistor 257 is conductive. The current mirror of transistors 251, 253, 247, and 249 then multiplies the desired current level of $I_{HIGHCHARGE}$ by K to provide current $K*I_{HIGHCHARGE}$ to node 202 for charging the voltage of node 202. In some embodiments, the current level of $I_{HIGHCHARGE}$ is changed during a charging operation to adjust the amount of current provided to node 202.

In some embodiments, as the voltage of node 202 increases past the threshold voltage of transistor 107 during a charging operation, most of the current $K*I_{HIGHCHARGE}$ provided to node 202 is used to charge the intrinsic gate-drain capacitance ($C_{GD}$) of transistor 107 due to the Miller effect. In some embodiments, the level of $I_{HIGHCHARGE}$ is set by the SLOPE CONTROL signal to obtain a desired slope of the drain-gate voltage and the drain-source voltage of transistor 107 during a charging operation.

Low charge circuit 240 includes a current mirror including transistors 241, 243, 239, and 245. In one embodiment, the current mirror of transistors 241, 243, 239, and 245 is configured to multiply the current through the current path of transistors 241 and 239 by a multiplier of L. In one embodiment, L is 10, but may be of other values in other embodiments. Circuit 240 includes a buffer transistor 237, whose gate is connected to a VDDA power supply terminal. Circuit 240 also includes a control transistor 235 for enabling circuit 240, whose gate receives the LC signal from circuit 222. Circuit 240 also includes transistor 233 which is part of a current mirror with transistor 231. In one embodiment, the sizes of transistors 233 and 231 are configured for the current mirror to divide the reference current ($I_{REF}$) through the path of transistors 235 and 237 when transistor 235 is conductive. The current mirror of transistors 241, 243, 239, and 245 then multiplies the divided reference current (($1/N)*I_{REF}$) to provide current $L*(1/N)*I_{REF}$ to node 202 to hold the voltage of node 202. In one embodiment, N is 10, but may be of other values in other embodiments. In one embodiment, $I_{REF}$ is 5 uA, but may be of other values in other embodiments. In other embodiments, the $I_{REF}$ would not be divided and multiplied by the current mirrors of circuit 240.

One advantage of the embodiment shown is that reference circuit 223 is utilized to both provide the reference current to comparator circuit 212 and to set the low charge current for circuit 240. Other embodiments may include two different reference circuits for these functions.

In the embodiment shown, the PFET current mirrors for circuit 250 and for circuit 240 each include two PFET transistor sets (e.g. circuit 250 includes a transistor set of transistors 251 and 247 and a transistor set of transistors 253 and 249, and circuit 240 includes a transistor set of transistors 241 and 243 and a transistor set of transistors 239 and 245). Utilizing two transistors sets provides for a higher output impedance of the current mirror circuits. Also, utilizing two transistors sets along with transistors 255 and 237, allow for the use of lower voltage transistors for providing charging current from a higher voltage charge pump output (CP) without damaging the transistors of circuits 250 and 240 in that the voltage drop from the higher voltage output (CP) of charge pump 123 is distributed across the transistors.

In operation, when transistor 107 is in a nonconducting state and the gate-source voltage of transistor 107 is zero volts, the $ON_{N-1}$ signal changing from a low state to a high state causes the signal HC from circuit 222 to transition to a high state in that $I_M$ is less than $I_{REF}$ at that time. Asserting HC causes circuit 250 to supply current $K*I_{HIGHCURRENT}$ from charge pump 123 to node 202 to raise the voltage of node 202 to make transistor 107 conductive. The current $I_{HIGHCURRENT}$ is set by the SLOPE CONTROL signal. In one embodiment, $K*I_{HIGHCURRENT}$ is in the range of 15 uA to 1000 uA, but may be at other current values in other embodiments. As current is supplied from charge pump 123 to node 202, the voltage of the gate of transistor 107 starts to rise to where it reaches the voltage threshold of power transistor 107. At this time, transistor 107 begins to conduct. When drain-source voltage of transistor 107 drops to zero volts, the gate-source voltage of transistor 107 continues to increase until it passes the voltage of $V_{REF}$ where $I_M$ is greater than $I_{REF}$. At this point, HC transitions to a low state where circuit 250 is disabled and LC transitions to a high state where circuit 240 is enabled to provide a charge current of $L*(1/N)*I_{REF}$ to node 202. In one embodiment, current $L*(1/N)*I_{REF}$ is in the range of 5 uA but may be at other values in other embodiments. Providing the lower current $L*(1/N)*I_{REF}$ to node 202 holds the voltage of node 202 at a desired voltage level set by $V_{REF}$ for controlling the conductivity of transistor 107 at a desired level without causing an overvoltage condition.

In one embodiment, $V_{REF}$ is set to a level where the gate-source voltage of transistor 107 is at desired level and any further rise in voltage may cause an overvoltage condition of the gate-source voltage. In some embodiments, the lower current $L*(1/N)*I_{REF}$ is set to a value such that it holds the voltage at node 202 but does not significantly raise the voltage.

In one embodiment, the transistors of the current mirrors of FIG. 2 are implemented with long channel transistors in order to minimize device mismatch so as to improve circuit accuracy. In some embodiments, resistors 205 and 225 are matched and transistors 207 and 227 are matched to improve circuit accuracy.

Figure 3:
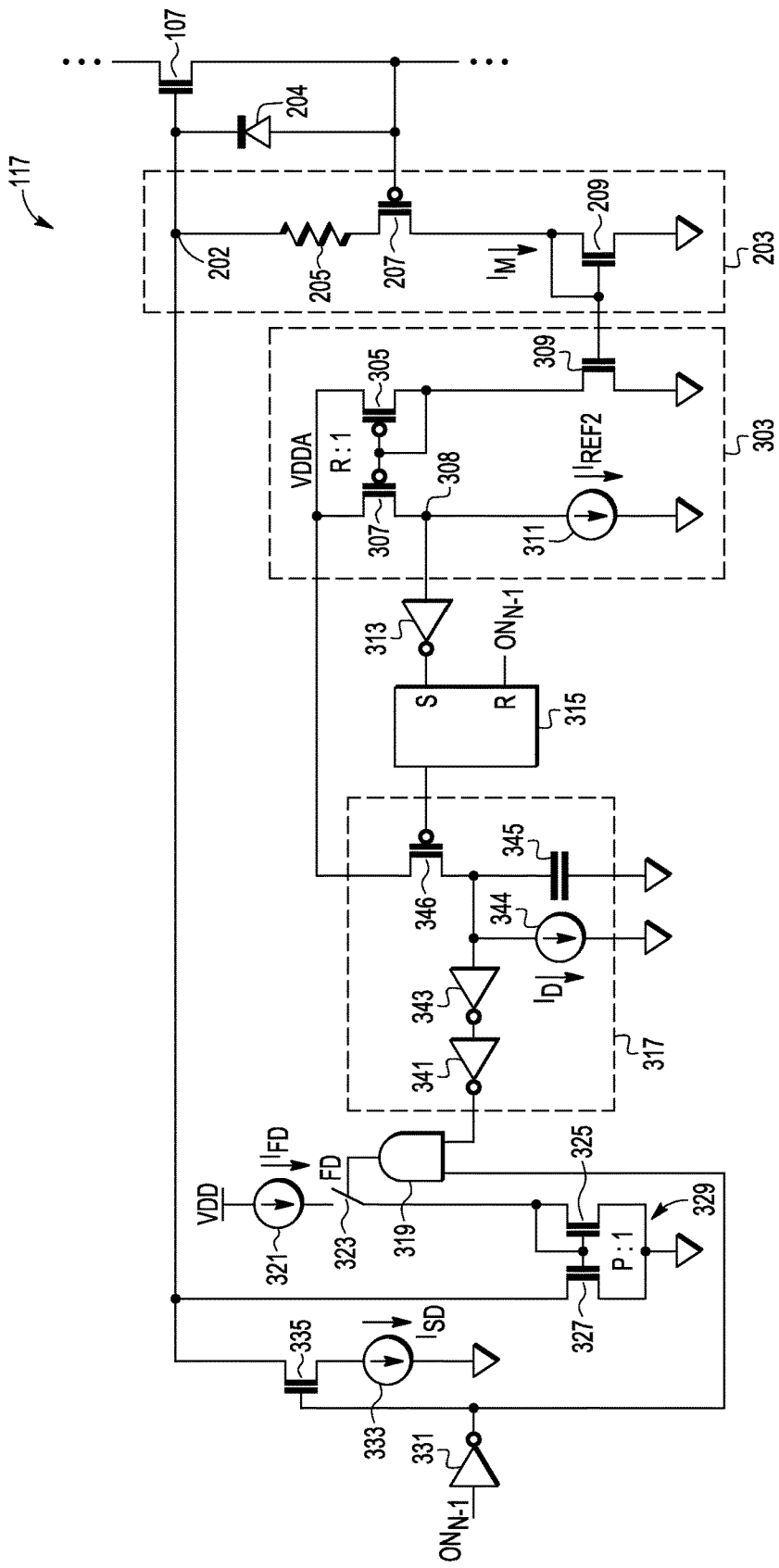
FIG. 3 is a circuit diagram of a portion of a control terminal control circuit according to one embodiment of the present invention.

FIG. 3 is a circuit diagram of a portion of control circuit 117 utilized to discharge current from node 202 during a discharge operation to change the conductivity state of transistor 107 or to hold the gate voltage of node 202 at a low voltage value. Circuit 117 includes a current comparator 303 with transistors 305, 307, and 309 and current source 311. In one embodiment, current source 311 provides a current of 250 nA, but may provide other values in other embodiments.

Current comparator 303 is used to determine when the gate-source voltage of transistor 107 is below a specific voltage value e.g. 100 mV which is represented by current $I_{REF2}$. The specific voltage value of $I_{REF2}$ represents a gate-source voltage in which transistor 107 is fully turned off. As long as the gate-source voltage of transistor 107 is above the specific voltage value, then current $I_M$ is greater than $I_{REF2}$ and the voltage of node 308 remains high. When current $I_M$ drops below $I_{REF2}$, the voltage of node 308 goes low indicating that the gate-source voltage of transistor 107 has dropped below the specific voltage value.

The voltage of node 308 is inverted by inverter 313 and provided to the SET input of flip-flop 315. The $ON_{N-1}$ signal is provided to the RESET input of flip-flop 315. The Q output of flip-flop 315 is provided to a delay circuit 317 that includes inverters 341, and 343, capacitor 345, transistor 346, and current source 344 for delaying the change in state of flip-flop 315 before being provided to AND gate 319. In one embodiment, circuit 317 may include two inverters (not shown) between the output of flip-flop 315 and the gate of transistor 346 to enhance the driving capability of the output signal of flip-flop 315. In one embodiment, capacitor 345 is 0.8 pf and current source 344 provides 1 uA of current, but these may be of other values in other embodiments depending upon the amount of delay to be provided. Some embodiments do not include a delay circuit. In other embodiments, delay circuit 317 includes a switch to turn off current source 344 when the $ON_{N-1}$ signal is high.

The output of AND gate 319 turns on enabling switch 323 which closes a current path from discharge current source 321 to a current mirror of transistors 325 and 327. In the embodiment shown, the current mirror is configured to multiply (by P) the discharge current $I_{FD}$ from current source 321 for discharging node 202 by current $P*I_{FD}$. In one embodiment, P=5, but may be of other values in other embodiments. In one embodiment, $I_{FD}$ is equal to 760 uA wherein node 202 is discharged at a current of 5*760 uA, but may be discharged at another current in other embodiments. The other input of AND gate 319 receives an inverted $ON_{N-1}$ signal from inverter 331. Thus, switch 323 is only closed when the $ON_{N-1}$ signal is low, indicating that transistor 107 should be off. In one embodiment, switch 323 is implemented with a NFET, but maybe implemented with other types of switches (e.g. a transmission gate, other types of transistors) in other embodiments.

The output of inverter 331 is also coupled to transistor 335 to enable current source 333 to provide current $I_{SD}$ to discharge node 202 when the $ON_{N-1}$ signal is low. In one embodiment, current $I_{SD}$ is 20 uA, but may be of other values in other embodiments.

During operation, when transistor 107 is on, $ON_{N-1}$ signal transitions from a high state to a low state by controller 131 to turn off transistor 107. Because when transistor 107 is conductive at that time, $I_M$ is greater than $I_{REF2}$ and therefor the S input of flip-flop 315 is at a low value when the $ON_{N-1}$ signal at the R input changes to the non-reset low state. Because the output of flipflop 315 is low at this time, switch 323 is closed. With switch 323 being closed, node 202 is discharged by a current of $P*I_{FD}$ from the current mirror of transistors 327 and 329 and by current $I_{SD}$ from current source 333. However, because current $P*I_{FD}$ is significantly greater than $I_{SD}$, node 202 is primarily discharged through transistor 327 to ground.

During discharge, once current $I_M$ drops below $R*I_{REF2}$ (e.g. 50 nA) (which is indicative of the gate-source voltage of transistor 107 falling below a specific voltage value (e.g. 0.7V), the S input of flip-flop 315 goes high to make the output of flip-flop 315 go high as well. After delay circuit 317 delays the transmission of the inverted output of flip-flop 315 going low at AND gate 319, switch 323 is opened. At this time, the only discharge path of node 202 is through current source 333 at current $I_{SD}$, where node 202 is continuously discharged as long as the $ON_{N-1}$ is low indicating that transistor 107 should be off. Such a discharge current prevents the gate of transistor 107 from floating and from undesirably turning on.

In one embodiment, the purpose of delay circuit 317 is to continue to discharge node 202 at a higher current rate for a limited amount of time even after $I_M$ drops below $I_{REF2}$. Transistor 107 becomes nonconductive when the voltage of node 202 drops below the threshold voltage of transistor 107. However, the voltage of node 202 still needs to be reduced to 0V from this point.

Providing a transistor control terminal control circuit with a voltage-to-current converter for providing an indication of the control terminal-to-current terminal voltage may allow in some embodiments for the indication of the control terminal-to-current terminal voltage for a stack of transistors where the control terminal and current terminal voltages vary with where the transistor is located in the stack. Providing such an indication allows for a charging circuit to charge quickly during a first part of a change in transistor state and to reduce the charge current when the transistor reaches a desired control terminal-to-current terminal voltage (as indicated by the measured current by the voltage-to-current converter) to prevent an overvoltage condition. Likewise, providing such an indication may allow for a discharging circuit to discharge the transistor quickly during an initial change in state and then apply a smaller discharge current afterwards to hold the control terminal at a discharge voltage level.

In other embodiments, a control circuit 117 may include two voltage-to-current converters for measuring the control terminal-to-current terminal voltage. One would be for the charging circuit (FIG. 2) and the other would be for the discharging circuit (FIG. 3). In some embodiments, the voltage-to-current converter 203 would only provide an indication of the control terminal-to-current terminal voltage to the charging circuit (FIG. 2) and not to the discharging circuit (FIG. 3). In other embodiments, voltage-to-current converter 203 would only provide an indication of the control terminal-to-current terminal voltage to the discharging circuit (FIG. 3) and not to the charging circuit (FIG. 2). In other embodiments, the charging circuit may have other configurations and/or the discharging circuit may have other configurations. In still other embodiments, the control circuit 117 can be used with PFET power transistors where the charging circuit is used to turn off the PFET and the discharging circuit is used to turn on the PFET. In still other embodiments, control circuit 117 can be used to control the conductivity of a bipolar transistor where converter 203 measures the base-emitter voltage.

Features shown or described with respect to one embodiment may be implemented with other embodiments shown or described.

As described herein, a current terminal of a transistor being "directionally coupled" to another node or device means that the current terminal is coupled either directly or indirectly to the node or device by a path other than through the channel of the transistor of the current terminal or through a power supply terminal. For example, the source of transistor 209 is directionally coupled to a ground terminal but is not directionally coupled to transistor 207 or transistor 309.

In one embodiment, a circuit includes a first output. The first output provides a control signal to a control terminal of a first transistor. The circuit includes a voltage-to-current converter including a first input coupled to the first output and a second input for coupling to a current terminal of the first transistor. The voltage-to-current converter includes a second output for providing an indication of a control terminal-to-current terminal voltage of the first transistor. The circuit includes control circuitry for controlling current applied to the control terminal of the first transistor. The control circuitry includes a third input to receive the indication for use in controlling the current applied by the first output.

In another embodiment, a method includes providing a control signal to a control terminal of a transistor by a control circuit, measuring a control terminal-to-current terminal voltage of the transistor by a voltage-to-current converter and providing a measuring current indicative of the control terminal-to-current terminal voltage of the transistor, and utilizing the measuring current to change a current of the control signal.

In another embodiment, a circuit includes a stack of transistors stacked in series, a charge pump, and a plurality of control circuits. Each control circuit of the plurality of control circuits providing a control signal to a control terminal of a corresponding transistor of the stack. Each control circuit includes a first output for providing the control signal to a control terminal of the corresponding transistor of the stack and a voltage-to-current converter including a first input coupled to the first output and a second input coupled to a current terminal of the corresponding transistor. The voltage-to-current converter includes a second output for providing an indication of a control terminal-to-current terminal voltage of the corresponding transistor. The circuit includes control circuitry for controlling current provided from the charge pump to the first output for charging the first output. The control circuitry includes a comparator wherein the control circuitry reduces charging current to the first output from the charge pump based on the indication indicating a higher control terminal-to-current terminal voltage than a first voltage as determined by the comparator.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
   a first output, the first output providing a control signal to a control terminal of a first transistor;
   a voltage-to-current converter including a first input coupled to the first output and a second input for coupling to a current terminal of the first transistor, the voltage-to-current converter including a second output for providing an indication of a control terminal-to-current terminal voltage of the first transistor;
   control circuitry for controlling current applied to the control terminal of the first transistor, wherein the control circuitry includes a third input to receive the indication for use in controlling the current applied by the first output;
   wherein the voltage-to-current converter produces a measuring current indicative of the control terminal-to-current terminal voltage of the first transistor;
   wherein the control circuitry includes a current comparator, wherein the control circuitry reduces charging current provided to the first output based on the measuring current being greater than a first current as determined by the current comparator during a charging operation.

2. The circuit of claim 1 wherein the first transistor is a FET, the control terminal is a gate of the FET, and the current terminal is a source of the FET.

3. The circuit of claim 1 further including the first transistor, wherein the second input is coupled to the current terminal of the first transistor and the first output is coupled to the control terminal of the first transistor.

4. A circuit comprising:
   a first output, the first output providing a control signal to a control terminal of a first transistor;
   a voltage-to-current converter including a first input coupled to the first output and a second input for coupling to a current terminal of the first transistor, the voltage-to-current converter including a second output for providing an indication of a control terminal-to-current terminal voltage of the first transistor;
   control circuitry for controlling current applied to the control terminal of the first transistor, wherein the control circuitry includes a third input to receive the indication for use in controlling the current applied by the first output;
   wherein the control circuitry includes a comparator wherein the control circuitry reduces charging current provided to the first output based on the indication indicating a higher control terminal-to-current terminal voltage than a first voltage as determined by the comparator.

5. The circuit of claim 4 comprising a first charge circuit and a second charge circuit, wherein the first charge circuit is configured to charge the first output at a first current level and the second charge circuit is configured to charge the first output at a second current level, wherein the first current level is greater than the second current level, wherein the control circuitry disables charging from the first charge circuit based on the indication indicating a higher control terminal-to-current terminal voltage than the first voltage, wherein the second charge circuit charges the first output after the first charge circuit has been disabled during a charging operation.

6. The circuit of claim 4, wherein the comparator is a current comparator, the control circuitry includes a reference current circuit that generates a reference current indicative of the first voltage, wherein the voltage-to-current converter produces a measuring current indicative of the control terminal-to-current terminal voltage, wherein the current comparator compares the reference current with the measuring current and reduces a charging current to the first output based on the comparison of the reference current and the measuring current.

7. The circuit of claim 6 comprising a first charge circuit and a second charge circuit, wherein the first charge circuit is configured to charge the first output at a first current level and the second charge circuit is configured to charge the first output at a second current level, wherein the first current level is greater than the second current level, wherein the control circuitry disables charging from the first charge circuit based on the indication indicating a higher control terminal-to-current terminal voltage than the first voltage, wherein the second charge circuit charges the first output after the first charge circuit has been disabled during a charging operation, wherein the second current level is dependent upon the reference current.

8. The circuit of claim 6 wherein:
the voltage-to-current converter includes a second transistor having a control terminal directionally coupled to the first current terminal of the first transistor and a first current terminal directionally coupled to the first output through a first resistive element;
wherein the reference current circuit includes third transistor having a control terminal directionally coupled to a second power supply terminal and a first current terminal directionally coupled to a voltage terminal through a second resistive element;
wherein the first resistive element and the second resistive element are a same size and device type and the second transistor and the third transistors are a same size and device type.

9. A circuit comprising:
a first output, the first output providing a control signal to a control terminal of a first transistor;
a voltage-to-current converter including a first input coupled to the first output and a second input for coupling to a current terminal of the first transistor, the voltage-to-current converter including a second output for providing an indication of a control terminal-to-current terminal voltage of the first transistor;
control circuitry for controlling current applied to the control terminal of the first transistor, wherein the control circuitry includes a third input to receive the indication for use in controlling the current applied by the first output;
wherein the first transistor is stacked in series with a plurality of transistors in a stack, wherein the first transistor is not located in an end transistor position of the stack.

10. The circuit of claim 9 further comprising:
a third output, the third output for providing a control signal to a control terminal of a second transistor of the stack;
a second voltage-to-current converter including a fourth input coupled to the third output and a fifth input for coupling to a current terminal of the second transistor, the second voltage-to-current converter including a fourth output for providing an indication of a control terminal-to-current terminal voltage of the second transistor;
a second control circuitry for controlling current applied by the third output, wherein the second control circuitry includes a sixth input to receive the indication from the second voltage-to-current converter for use in controlling the current applied by the third output.

11. The circuit of claim 10 further comprising:
a charge pump;
wherein the control circuitry includes a first comparator, wherein the control circuitry reduces charging current provided from the charge pump to the first output based on the indication from the voltage-to-current converter indicating a higher control terminal-to-current terminal voltage of the first transistor than a first voltage as determined by the first comparator;
wherein the second control circuitry includes a second comparator, wherein the second control circuitry reduces charging current from the charge pump provided to the third output based on the indication from the second voltage-to-current converter indicating a higher control terminal-to-current terminal voltage of the second transistor than a voltage as determined by the second comparator.

12. The circuit of claim 9 wherein:
the voltage-to-current converter produces a measuring current indicative of the control terminal-to-current terminal voltage of the first transistor;
the control circuitry includes a current comparator, wherein the control circuitry reduces charging current provided to the first output based on the measuring current being greater than a first current as determined by the current comparator during a charging operation.

13. The circuit of claim 9 wherein the voltage-to-current converter produces a measuring current indicative of the control terminal-to-current terminal voltage of the first transistor, the control circuitry includes a comparator, wherein the control circuitry reduces discharge current from the first output based on the measuring current being less than a first current as determined by the comparator.

14. The circuit of claim 13 wherein the comparator is a current comparator.

15. A circuit comprising:
a first output, the first output providing a control signal to a control terminal of a first transistor;
a voltage-to-current converter including a first input coupled to the first output and a second input for coupling to a current terminal of the first transistor, the voltage-to-current converter including a second output for providing an indication of a control terminal-to-current terminal voltage of the first transistor;
control circuitry for controlling current applied to the control terminal of the first transistor, wherein the control circuitry includes a third input to receive the indication for use in controlling the current applied by the first output;
a first comparator, wherein the control circuitry reduces charging current to the first output based on the indication indicating a higher control terminal-to-current terminal voltage than a first voltage as determined by the first comparator;
a second comparator, wherein the control circuitry reduces discharge current from the first output based on the indication indicating a lower control terminal-to-current terminal voltage than a second voltage as determined by the second comparator.

16. A method comprising:
providing a control signal to a control terminal of a transistor by a control circuit;
measuring a control terminal-to-current terminal voltage of the transistor by a voltage-to-current converter and providing a measuring current indicative of the control terminal-to-current terminal voltage of the transistor;
utilizing the measuring current to change a current of the control signal;
providing a second control signal to a second control terminal of a second transistor by a second control circuit;
measuring a second control terminal-to-current terminal voltage of the second transistor by a second voltage-to-current converter and providing a second measuring current indicative of the second control terminal-to-current terminal voltage of the second transistor;
utilizing the second measuring current to change a current of the second control signal;

wherein the transistor and the second transistor are located in series in a stack of transistors.

17. The method of claim 16 wherein the transistor is a FET, the control terminal is a gate of the FET and the current terminal is a source of the FET.

18. The method of claim 16 wherein:
the providing the control signal includes discharging current from the control terminal of the transistor;
wherein the utilizing the measuring current includes comparing the measuring current to a first current, and reducing a current level of the current discharged from the control terminal when the measuring current is less than the first current indicating that the control terminal-to-current terminal voltage is less than a first voltage level.

19. A method comprising:
providing a control signal to a control terminal of a transistor by a control circuit;
measuring a control terminal-to-current terminal voltage of the transistor by a voltage-to-current converter and providing a measuring current indicative of the control terminal-to-current terminal voltage of the transistor;
utilizing the measuring current to change a current of the control signal;
wherein the providing the control signal includes providing current to the control terminal of the transistor;
wherein the utilizing the measuring current includes comparing the measuring current to a first current, and reducing a current level of the current provided to the control terminal when the measuring current exceeds the first current indicating that the control terminal-to-current terminal voltage exceeds a first voltage level.

20. The method of claim 19 further comprising:
providing a second control signal to a second control terminal of a second transistor by a second control circuit;
measuring a second control terminal-to-current terminal voltage of the second transistor by a second voltage-to-current converter and providing a second measuring current indicative of the second control terminal-to-current terminal voltage of the second transistor;
utilizing the second measuring current to change a current of the second control signal;
wherein the transistor and the second transistor are located in series in a stack of transistors.

21. A circuit comprising:
a stack of transistors stacked in series;
a charge pump;
a plurality of control circuits, each control circuit of the plurality of control circuits providing a control signal to a control terminal of a corresponding transistor of the stack, each control circuit including:
a first output for providing the control signal to a control terminal of the corresponding transistor of the stack;
a voltage-to-current converter including a first input coupled to the first output and a second input coupled to a current terminal of the corresponding transistor, the voltage-to-current converter including a second output for providing an indication of a control terminal-to-current terminal voltage of the corresponding transistor;
control circuitry for controlling current provided from the charge pump to the first output for charging the first output, wherein the control circuitry includes a comparator wherein the control circuitry reduces charging current to the first output from the charge pump based on the indication indicating a higher control terminal-to-current terminal voltage than a first voltage as determined by the comparator.

* * * * *